United States Patent [19]

Diaz

[11] Patent Number: 5,760,445
[45] Date of Patent: Jun. 2, 1998

[54] DEVICE AND METHOD OF MANUFACTURE FOR PROTECTION AGAINST PLASMA CHARGING DAMAGE IN ADVANCED MOS TECHNOLOGIES

[75] Inventor: Carlos H. Diaz, Palo Alto, Calif.

[73] Assignee: Hewlett-Packard Company, Palo Alto, Calif.

[21] Appl. No.: 822,365

[22] Filed: Mar. 20, 1997

Related U.S. Application Data

[63] Continuation of Ser. No. 571,685, Dec. 13, 1995, abandoned, which is a continuation of Ser. No. 305,229, Sep. 13, 1994, abandoned.

[51] Int. Cl.[6] .................................................. H01L 23/62
[52] U.S. Cl. ........................ 257/356; 257/360; 257/361
[58] Field of Search ................................ 257/360, 361, 257/362, 356, 357

[56] References Cited

U.S. PATENT DOCUMENTS

| | | |
|---|---|---|
| 4,400,711 | 8/1983 | Avery . |
| 4,609,931 | 9/1986 | Koike ........................... 251/361 |
| 4,786,956 | 11/1988 | Puar ............................. 251/361 |
| 4,994,874 | 2/1991 | Shimizu et al. .............. 251/362 |
| 5,436,183 | 7/1995 | Davis et al. ................. 237/40 |

OTHER PUBLICATIONS

Hyungcheol Shin, Zhi–Jian Ma and Chenming Hu, "Impact of Plasma Charging Damage and Diode Protection on Scaled Thin Oxide", IEEE, 1993, pp. 467–470.

F. Shone, K. Wu, J. Shaw, E. Hokelek, S. Mittal, and A. Haranahalli, "Gate Oxide Charing and its Elimination for Metal Antenna Capacitor and Transistor in VLSI CMOS Double Layer Metal Technology", pp. 73–74.

*Primary Examiner*—Ngân V. Ngô
*Attorney, Agent, or Firm*—Denise A. Lee; Timothy R. Croll

[57] ABSTRACT

A protection device which protects against charge build up on a thin oxide gate during plasma etching is provided. The protection device may be described as a floating well PMOS device. When the PMOS transistor is formed, a lateral parasitic pnp transistor is also formed. In the lateral pnp device the base is floating, the collector is connected to ground and the emitter is connected to the gates of the host PMOS protection device and the device to be protected. In operation, the gate of the PMOS transistor is tied to the source of the PMOS transistor so that the PMOS transistor is off. Thus, the lateral pnp transistor controls the charging and discharging of the charge stored on the gate oxide. Excessive charge build up is prevented by the breakdown voltage of the lateral pnp transistor. Because protection is achieved by pnp breakdown operation, the size of the pnp protection device can be substantially lower than other protection devices.

23 Claims, 4 Drawing Sheets

DEVICE AND METHOD OF MANUFACTURE FOR PROTECTION AGAINST PLASMA CHARGING DAMAGE IN ADVANCED MOS TECHNOLOGIES

CROSS REFERENCE TO RELATED APPLICATIONS

This is a continuation of application Ser. No. 08/571,685 filed on Dec. 13, 1995, now abandoned, which is a continuation of application Ser. No. 08/305,229 filed on Sep. 13, 1994, now abandoned.

BACKGROUND OF THE INVENTION

The invention relates generally to protection for integrated circuits and more particularly to gate oxide protection devices for protection against charge build up on the gate oxide of a MOS device during plasma processing.

During integrated circuit device fabrication, metal or polysilicon lines are typically used to interconnect integrated circuit devices. Thus for MOS devices, long metal or polysilicon interconnect lines (antennas) that may accumulate charge during plasma etching may be connected to the gate of the device. Because of the relatively high capacitance of the MOS gate, charge build up occurs disproportionately at the gate of the MOS device. Because the gate has such a thin oxide, it is particularly sensitive to damage due to plasma etch charge build up.

The performance of MOS devices is degraded by charge build-up caused by certain plasma etching processes. Plasma charging can produce various forms of radiation damage in the materials being etched, including (1) formation of electron traps in gate oxides and (2) displaced and implanted atoms at the material surface due to ion bombardment. The trapped charges decrease breakdown voltage of the oxide and if not annealed out, can cause shift in the threshold voltages resulting in reliability failures. Further, the surface states formed at the oxide-semiconductor interface degrade transistor characteristics such as subthreshold slope, transconductance, and device lifetime under hot electron stress.

The article "Gate Oxide Charging and its Elimination for Metal Antenna Capacitor and Transistor in VLSI CMOS Double Layer Metal Technology", F. Shone et al., Sym. VLSI Tech. Dig. Papers, pp. 73–74, 1989, describes two process related solutions to minimize plasma charging damage. First, increasing the alloy cycle time is believed to anneal out surface states resulting in improved hot electron reliability. Another process related solution is the addition of a thin dielectric layer on top of the metal layer. This is believed to reduce the efficiency with which the antenna (the large sections of metal or polysilicon interconnect lines connected to the gate) collects charge from the plasma. Although these methods have been shown to reduce the oxide damage due to plasma charging, they add complexity to the fabrication process, increase process cost, and impact the cycle times. For these reasons, a circuit approach has been studied.

A protection device may be connected to the gate to minimize charge build up during plasma processing. The article "Impact of Plasma Charging Damage and Diode Protection on Scaled Thin Oxide," Shin et al., IEEE, IEDM 93 pp. 467–470, describes a diode protection circuit which minimizes the effects of plasma charging. FIG. 1A shows a schematic representation of a thin oxide plasma protection diode 102. FIG. 1B shows a cross-sectional view of the protection device shown in FIG. 1A.

The polysilicon gate, covering the gate oxide 104, of the device to be protected is connected to an n-island 106 in a p-substrate 108 via metal line 110. The charge collecting material is represented by an antenna 107. The n-island 106 and p-substrate 108 form a diode 102. As positive charge is deposited on the gate oxide 104, excess charge accumulated on gate flows through diode 102 operating in reverse mode. To increase the efficiency with which the diode 102 drains charge to the substrate, the related plasma etching process should be done under controlled light intensity conditions to guarantee sufficiently high levels of diode leakage current.

The diode protection circuit shown in FIG. 1 works well as long as the plasma charging current is less than the leakage current of the diode. The drawback of this approach is that for effective protection of thin gate oxides, a penalty in silicon area is paid since diode leakage current is proportional to its area. Thus for example, to provide sufficient protection for the thin gate oxide, the protection device calls for a 100 μm×100 μm area. Diode protection would also provide effective protection if the diode breakdown voltage is lower than the gate oxide failure voltage. However, for technologies with gate oxides less than 12 nm, the diode breakdown voltages are generally greater than the thin oxide failure voltages rendering diode protection ineffective.

Therefore, there is a need for an area efficient protection device which protects against plasma charging damage of thin oxides regardless of plasma polarity and which does not require special processing steps which increase process cycle times and process and device cost.

SUMMARY OF THE INVENTION

A protection device which protects a thin oxide gate against charge build up during plasma etching is provided. The protection device does not require special processing steps, is area efficient and is effective regardless of the polarity of the plasma charging current. The protection device for discharging charge from an oxide region of a first integrated circuit device is comprised of a first and a second region, both regions having a first conductivity type, the first and second regions formed in a well region having a second opposite conductivity type. The well region formed in a substrate having a first conductivity type. A dielectric region or gate of the protection device is located above the substrate between the first and second regions and is electrically coupled to a dielectric region of the device to be protected.

In the preferred embodiment, the dielectric region of the device to be protected is the gate of a MOS transistor or a capacitor. The device to be protected is comprised of first and second regions having a second conductivity type formed in the substrate and a gate or dielectric region located above the substrate surface between the first and second regions of the device to be protected. In the preferred embodiment, the gate of the protection device is electrically coupled to both the first region of the protection device and the gate of the device to be protected via a conductive layer. Further, the second region of the protection device is connected to the substrate.

In the preferred embodiment, the first conductivity type is p-type. Thus in the preferred embodiment, the protection device may be described as a PMOS device whose source and gate are connected to the gate of the device to be protected. Alternatively, the protection device may be described as a lateral pnp transistor. When the PMOS transistor is formed, a lateral pnp transistor is also formed. The base of the lateral pnp corresponds to the floating n-well region of the PMOS device, the collector of the lateral pnp transistor corresponds to the drain of the PMOS device, and the emitter of the lateral pnp device corresponds to the source of the PMOS device. In the lateral pnp device the base is floating, the collector is connected to the substrate (which is generally grounded) and the emitter is connected to the gates of both the PMOS host device and the MOS device or the gate-oxide capacitor to be protected.

In the preferred embodiment, the protection device is a PMOS transistor and the integrated circuit device to be protected is any device with a thin gate-oxide such as the gate of a MOS transistor or a MOS capacitor. Alternatively, the conductivity types can be switched so that the protection device is a NMOS transistor in a floating p-well in a n-type substrate. When the protection device is an NMOS transistor, the second region of the protection device that is connected to the substrate is generally coupled to a power supply voltage $V_{DD}$ instead of ground.

In operation, the gate of the PMOS transistor is tied to the source of the PMOS transistor so that the PMOS transistor is off. Thus, the lateral pnp open-base transistor controls the charging and discharging of the charge stored on the gate oxide. Unlike the substrate protection diode which depends on leakage current to prevent charge build up in excess of the breakdown voltage of the thin oxide layer, excessive charge build up is prevented by the breakdown voltage of the lateral pnp transistor. Because protection is achieved by pnp open-base breakdown operation and does not rely on leakage current levels, the size of the pnp protection device can be substantially lower than that for a substrate diode offering an equivalent protection level.

A further advantage of the protection structure described by the present invention, is that in contrast to conventional protection schemes that can only protect effectively for one polarity of plasma charging, the floating-base lateral pnp device proposed will protect the gate regardless of the plasma polarity. If plasma etching causes a negative charge to the metal, the transistor operates as a PMOS device with a low drain-source voltage. If plasma etching causes a positive charge to metal, the transistor protection device operates as a lateral pnp transistor in open-base mode. In contrast, a substrate diode protects against accumulation of negative charge to the metal by forward mode conduction. However, accumulation of a positive charge will rely on leakage current and/or diode breakdown which may not be either area efficient or may be ineffective in advanced processes where diode-breakdown is larger than the gate-oxide failure voltage.

Additionally, compared to conventional substrate diode protection devices, process steps aimed solely at addressing damage resulting from plasma charging are eliminated. The transistor protection device described by the present invention may be formed simultaneously with other process steps for the formation of other MOS devices. Thus, additional steps such as increasing the alloy cycle time or application of an additional dielectric layer on top of the metal are eliminated. Elimination of process steps directed towards the plasma charge build up reduces device processing costs. Further, the described PMOS/lateral pnp protection device provides a low voltage clamp to plasma charges from thin gate oxides; the voltage clamp threshold can be easily varied by variance of the device layout. For example, the clamp voltage can be set to a value less than the thin oxide breakdown voltage by an appropriate selection of the channel length of the host PMOS device.

A further understanding of the nature and advantages of the invention described herein may be realized by reference to the remaining portions of the specification and the attached drawings.

DESCRIPTION OF THE PREFERRED EMBODIMENTS

Figure 1A:
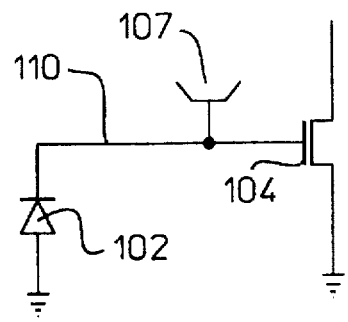
FIG. 1A shows a schematic representation of a prior art thin oxide plasma protection diode.
Figure 1B:
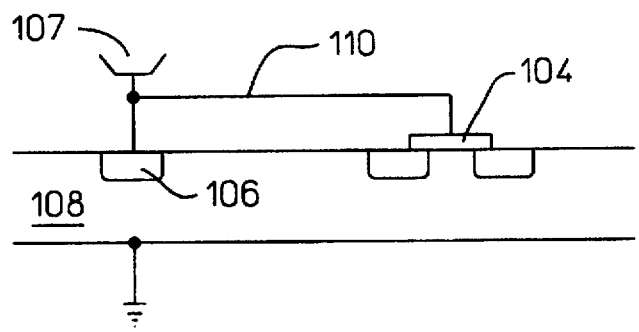
FIG. 1B shows a cross-sectional view of a prior art charge protection diode shown in FIG. 1A.
Figure 2A:
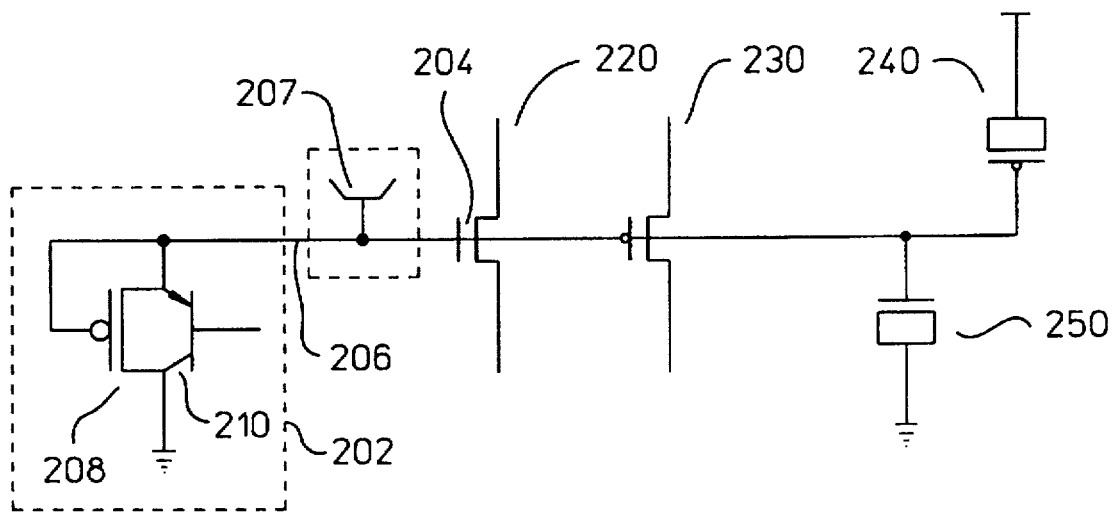
FIG. 2A shows a schematic representation of a plasma protection device coupled to a PMOS transistor, an NMOS transistor, a PMOS capacitor, and an NMOS capacitor to a preferred embodiment of the present invention.

The plasma charging protection device is a transistor connected to an oxide region of an integrated circuit device to be protected. The protection device is typically coupled to the gate-oxide of a MOS transistor, however, there may be other dielectric or oxide regions of an integrated circuit device that could also be protected from plasma charging damage by connecting the oxide region to a protection device in a similar way. For example, FIG. 2A shows a schematic representation the protection device 202 and its connection to the gate oxide region 204 of a NMOS transistor 220, the gate oxide region 205 of a PMOS transistor 230, the oxide region 207 of a PMOS capacitor 240, and the oxide region 209 of a NMOS capacitor 250. A metal, polysilicon or other conductive layer electrically couples the thin oxide regions 204, 205, 207, 209 to the protection device 202.

The protection device 202 can be described in the preferred embodiment as a PMOS transistor in floating n-well or alternatively as a lateral pnp transistor in open-base mode. The schematic shown in FIG. 2A represents the protection device 202 as a PMOS transistor 208 in parallel with its parasitic lateral pnp bipolar transistor 210.

Figure 2B:
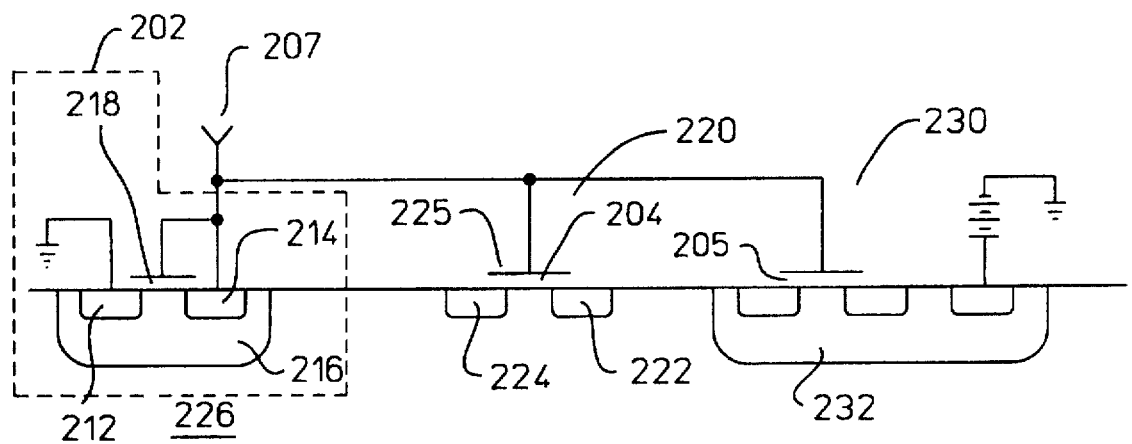
FIG. 2B shows a cross-sectional view of the plasma protection device coupled to a PMOS and NMOS transistor.

FIG. 2B shows a cross sectional view of the plasma protection device 202 shown in FIG. 2A according to the preferred embodiment of the invention. Referring to FIG. 2B, the protection device 202 is a MOS device having a first region 212, the drain, and a second region 214, the source, both having a first conductivity type. The drain 212 and the source 214 regions are formed within a well region 216 having a second opposite conductivity type. The well region is formed on a substrate having a first conductivity type.

In the preferred embodiment, the first conductivity type is p-type. Thus in the preferred embodiment, the protection device 202 is a PMOS device whose gate 218 and source 214 are connected to the gate 220 or other thin dielectric region of a device to be protected. In the preferred embodiment, the p-type substrate includes an epitaxial layer 226 formed on the surface of the original p-type substrate 228. Alternatively, the protection device 202 may be described as a lateral pnp transistor. When the PMOS transistor is formed, a lateral pnp transistor is also formed. The base of the lateral pnp transistor is the floating n-well 216 of the PMOS device, the emitter of the lateral pnp transistor is the source 214 of the PMOS device, and the collector of the lateral pnp device is the drain 212 of the PMOS device. The effective base-width of the parasitic lateral pnp bipolar transistor is equal to the channel length of its PMOS host 208.

Figure 2C:
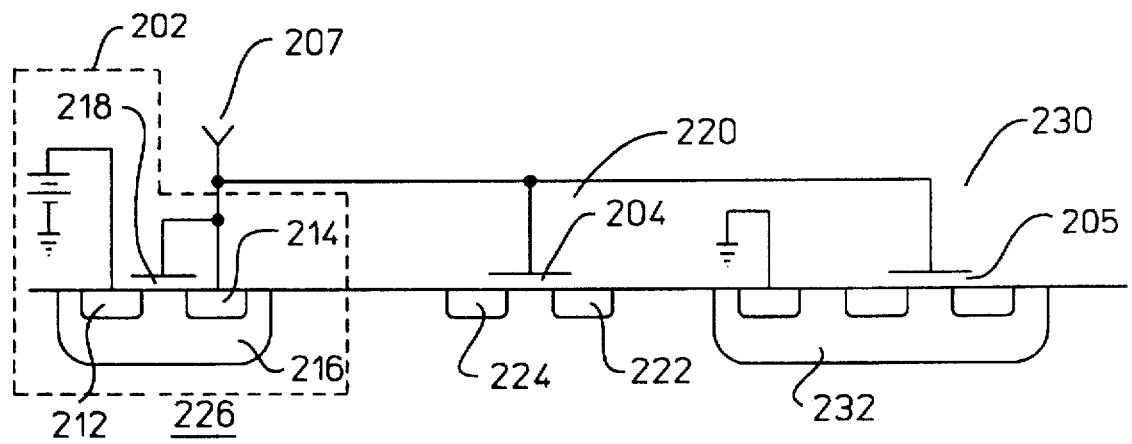
FIG. 2C shows a cross-sectional view of an alternative embodiment of the plasma protection device coupled to a PMOS and NMOS transistor.

The device to be protected may be any device having a oxide region which may be damaged by charge build up during plasma charging but is typically a NMOS transistor gate, a PMOS transistor gate and/or a gate-oxide capacitor. Referring to FIG. 2A, it can be seen that the PMOS protection device may be connected to the gates of: a NMOS transistor 220, a PMOS transistor 230, a PMOS capacitor 240, or a NMOS capacitor 250. For illustration purposes, FIGS. 2B and 2C show the protection device connected to a PMOS transistor and a NMOS transistor. Although FIGS. 2B and 2C show the protection device coupled to two of the three types of devices, the protection device may be coupled to a single device type or a plurality of device types or a plurality of devices. Referring to FIG. 2B, in the preferred embodiment, the protection device is a PMOS transistor and the oxide to be protected is the gate oxide 204 of an NMOS transistor 220 including a source 222, a drain 224 and a gate 225. The protection device may also or may alternatively be electrically coupled to the gate oxide 205 of a PMOS transistor 230 formed in a n-well region 232. In FIG. 2C, the NMOS protection device is electrically coupled to the gate oxide region 204 of a PMOS transistor 220 and the gate oxide region 205 of a NMOS transistor 230 formed in a p-well region 232.

Referring to FIG. 2B, the drain 212 is connected to ground, while the gate 218 and source 214 of the PMOS protection device are electrically coupled to the gate of the device to be protected. Thus, the base 216 of the lateral pnp device is floating. The collector 212 is connected to ground and the emitter 214 is connected to the gate 218 of the host PMOS device 208 and the gate of the MOS device to be protected.

Because the gate 218 of the PMOS transistor 208 is connected to its source 214 (most positive terminal), the PMOS transistor 208 of the protection device is kept off at all times. This is necessary for the protection device 202 not to interfere with normal circuit operation. Because the n-well 216 is floating, the pnp lateral transistor operates in the open base mode.

Although in the preferred embodiment the protection device is a PMOS transistor and the integrated circuit device being protected is a MOS transistor and/or a gate-oxide capacitor, alternatively, the conductivity types can be reversed so that the protection device is an NMOS transistor fabricated in a p-well on a n-substrate. FIG. 2C shows a cross-sectional view of an alternative embodiment of the plasma protection device. In the alternative embodiment, the protection device 202 is an NMOS transistor so that the source and drain regions 214, 212 have an n-type conductivity and the well 216 has a p-type conductivity. The substrate 226 has a n-type conductivity. However as can be seen in FIG. 2C, when the protection device is an NMOS transistor, the drain 214 of the protection device 202 is connected to the n-substrate which is also tied to the power supply voltage $V_{DD}$.

During plasma etching, charge is collected by the metal lines connected to the polysilicon or conductive material that define the thin oxide region 204 of the device to be protected. As charge accumulates on the oxide region 204, a voltage builds up with respect to the substrate. The protection device 202 should guarantee that maximum voltage of the charge build up on the oxide region 204 is less than the breakdown voltage of the thin oxide by properly draining to the substrate any excess charge. In the protection device proposed here, this is achieved by the open base breakdown characteristics of the parasitic lateral pnp bipolar transistor in the preferred embodiment.

Figure 3A:
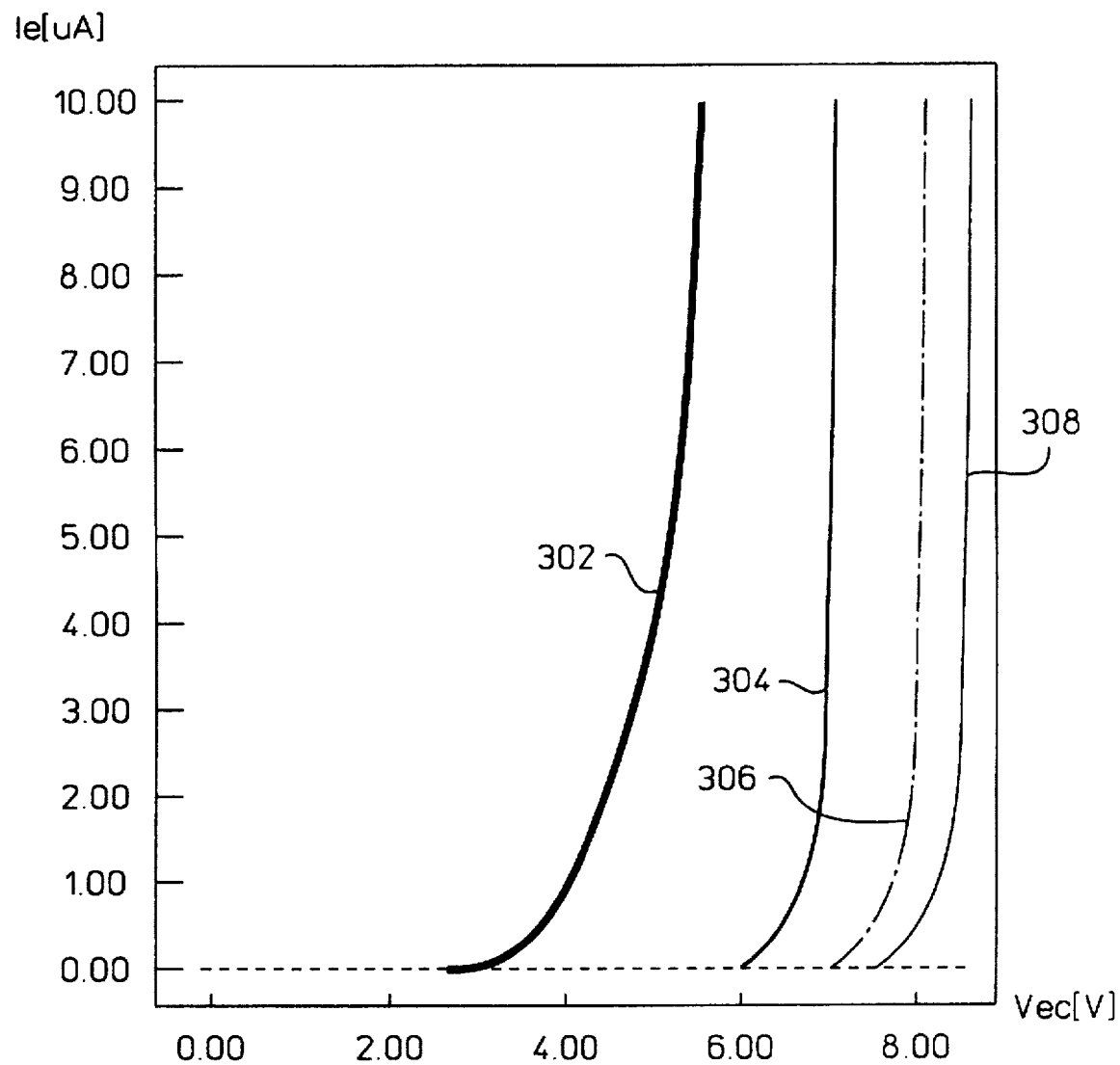
FIG. 3A shows the open-base breakdown voltage-current characteristic for the charge protection device having varied channel lengths according to the preferred embodiment of the present invention.

The open-base breakdown characteristics are determined by the technology's p-island to n-well breakdown voltage ($BV_{CBO}$) and the forward current gain of the pnp transistor ($\beta_F$). For a given $BV_{CBO}$, the open-base breakdown voltage ($BV_{CEO}$) can be reduced by increasing $\beta_F$ which in turn can be achieved by reducing the base width (channel length L of the host PMOS device). FIG. 3A shows a current-voltage characteristic of the breakdown voltage for the charge protection device according to the present invention. Experimental data shown in FIG. 3A shows the open-base breakdown characteristics (plot of emitter current $I_E$ vs. emitter-to-collector voltage $V_{EC}$) for different base widths. Line 302 shows the emitter current vs. the emitter-to-collector for a base width of 0.35 μm. Line 304 shows the emitter current vs. the emitter-to-collector voltage for a base width of 0.4 μm. Line 306 shows the emitter current vs. the emitter-to-collector voltage for a base width of 0.5 μm. Line 308 shows the emitter current vs. the emitter to-collector voltage for a base width of 0.7 μm.

As can be seen from FIG. 3A, the clamp voltage of the device increases as the base width of the protection device increases. Thus, the protection level (clamp voltage) can be set by circuit design to a level compatible with the thin oxide to be protected. For example, referring to FIG. 3A for an 8.0 nm thin oxide having a breakdown voltage of 8.0 volts, a floating well PMOS device with a 0.35 to 0.5 μm channel length would offer an appropriate protection level.

Figure 3B:
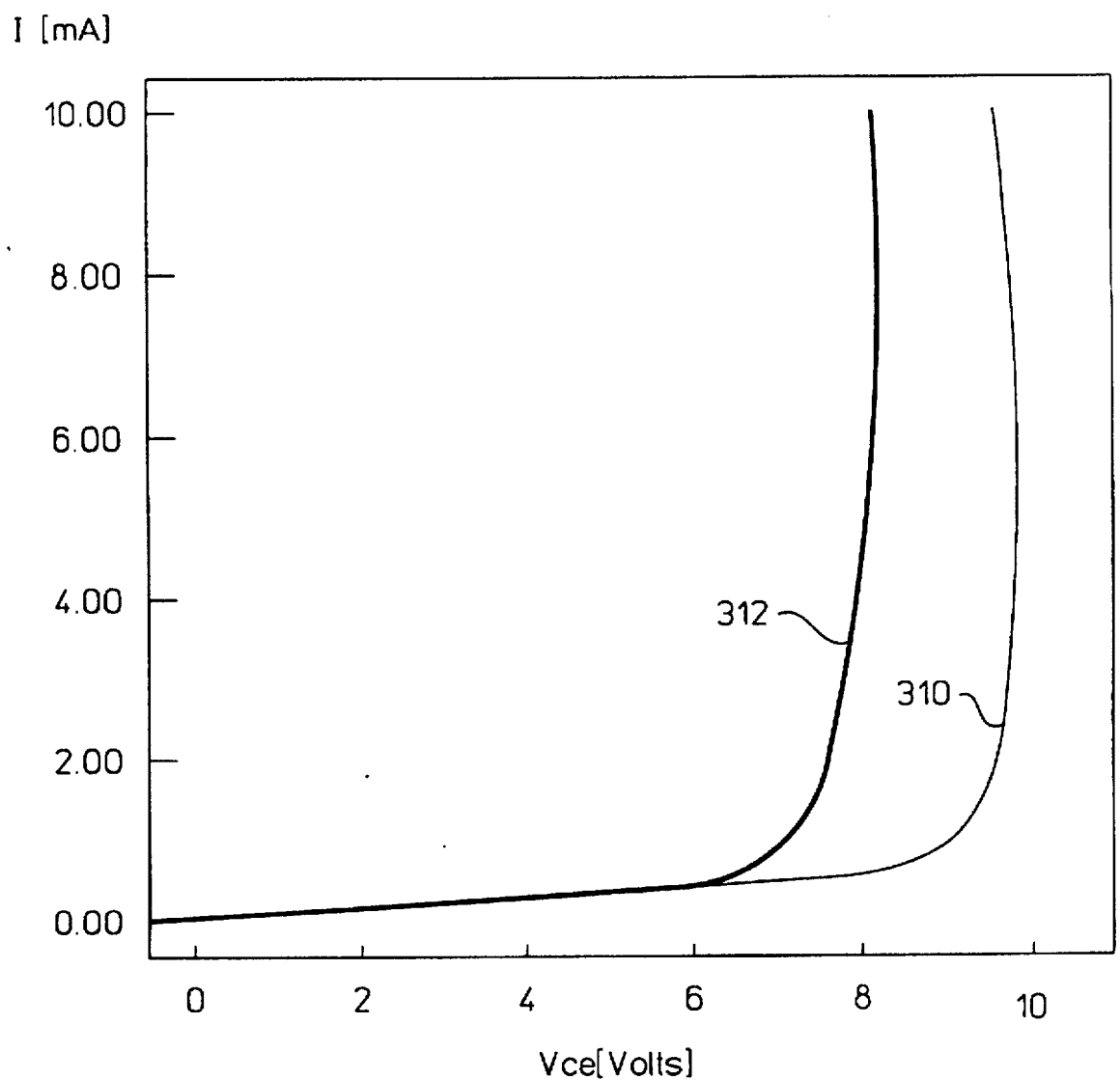
FIG. 3B shows the breakdown voltage-current characteristic for a predetermined channel length for both the protection diode and the protection device according to the preferred embodiment of the present invention.

FIG. 3A shows the breakdown voltage-current characteristic for the charge protection device having varied channel lengths according to the present invention. FIG. 3B compares the breakdown voltage-current characteristic for the charge protection diode (prior art) and the protection device according to the present invention. The breakdown characteristics of the protection diode and the protection device according to the present invention are fabricated using the same process technology for comparison. In FIG. 3B, line 310 shows the current vs. voltage for the diode protection device. Line 312 shows typical emitter current vs. the emitter-to-collector voltage for the protection device of the present invention. As can be seen from FIG. 3B, the protection device of the present invention has a lower clamping voltage (approximately 8 volts) compared to the diode protection device (prior art) which has a clamping voltage of approximately 10 volts.

The protection device structure can be built during the fabrication of the MOS devices which they protect. Although fabrication details may vary dependent on the protection level desired and the desired materials, the following process flow describes one preferred process. Typically, the devices are built in a p-epitaxial layer 4–5 μm on a p+ substrate. Active regions are patterned followed by standard LOCOS isolation process. Then, n-channel and p-channel implant are performed followed by the gate oxidation.

After the formation of the gate oxide, a layer of polysilicon is then deposited, typically by LPCVD, and the gate pattern is used during a polysilicon etch which is followed by poly-reoxidation. Next, a n-LDD pattern is formed and the phosphorus is implanted. Then, a p-LDD is patterned and boron implantation is performed. A TEOS sidewall spacer is formed followed by an arsenic implant in the n-channel source and drain regions and a $BF_2$ implant in the p-channel source and drain regions devices. Each implant is typically followed by a rapid thermal anneal (RTA) step.

At this point, conductive interconnections are formed between devices. In one embodiment, titanium silicide is deposited in the p and n-islands. A PGS glass is deposited as the first interlevel dielectric and contact windows are patterned and etched on the first interlevel dielectric. This is followed by a planarization step. After planarization, a TiN/W plug is deposited and patterned by a blanket etchback. This is followed by Ti/AlCu/TiN deposition to form the first-level metal interconnect. This step may be followed by a second-level dielectric deposition and planarization, contact-2 patterning, via etch, TiN/W deposition and blanked etch-back. A second level of Ti/AlCu/TiN is deposited, patterned and etched to form the second level of interconnect. Additional levels of interconnect are formed in a similar fashion.

It is understood that the above description is intended to be illustrative and not restrictive. The scope of the invention should be determined not with reference to the above description, but instead should be determined with reference to the appended claims, along with the full scope of equivalents to which such claims are entitled.

What is claimed is:

1. A method for protecting an oxide region of a device during plasma processing, the method comprising the following steps:

(a) forming, within a substrate having a first conductivity type, a well region formed in the substrate, the well region having a second opposite conductivity type;

(b) forming a gate region over a dielectric region, (c) forming a first region and a second region, the first and second regions having the first conductivity type, the dielectric region being located above the substrate surface between the first and second regions to form a MOS transistor;

(d) electrically coupling the gate region and the first region to the oxide region of the device;

(e) electrically floating the well region;

(f) electrically coupling the substrate to the second region; and, (g) performing a plasma etch, including the following substeps:

(g.1) building up charge on the oxide region, and (g.2) before the charge built up in substep (g.1) is sufficient to place a breakdown voltage across the oxide region, turning on the MOS transistor and draining the charge to avoid damage to the oxide region.

2. A method as in claim 1 wherein in step (a) the first conductivity type is p-type.

3. A method as in claim 2 additionally comprising the following step performed before step (g):

(h) electrically coupling the second region to ground.

4. A method as in claim 1 wherein in step (a) the first conductivity type is n-type.

5. A method as in claim 4 additionally comprising the following step performed before step (g):

(h) electrically coupling the second region to a power supply voltage.

6. A method as in claim 1 wherein in step (g) the oxide region is a gate dielectric region of a second MOS transistor device.

7. A method as in claim 1 wherein in step (g) the oxide region is a dielectric region of a gate-oxide capacitor.

8. A method as in claim 1 wherein in step (c) the clamping voltage of the MOS transistor is less than a dielectric breakdown voltage for a device which includes the oxide region.

9. A method as in claim 1:

wherein in step (a) the first conductivity type is p-type;

wherein the method additionally comprises the following step performed before step (g):

(h) electrically coupling the second region to ground; and, wherein in step (c) the first region of the MOS transistor is also the collector of a lateral pnp device, the well region corresponds to the base of the lateral pnp device, and the second region of the MOS transistor is also the collector of the lateral pnp device.

10. A method as in claim 1:

wherein in step (a) the first conductivity type is n-type;

wherein the method additionally comprises the following step performed before step (g):

(h) electrically coupling the second region to a power supply voltage; and, wherein in step (c) the first region of the MOS transistor is also the collector of a lateral npn bipolar device, the, well region corresponds to the base of the lateral bipolar device, and the second region of the MOS transistor is also the collector of the lateral npn bipolar device.

11. A method as in claim 1, wherein in substep (g.2) plasma charging damage to the oxide region is prevented regardless of polarity of the plasma.

12. A protection device for protecting an oxide region of a device from plasma charging damage while plasma processing during integrated circuit fabrication, the protection device comprising:

a substrate having a first conductivity type;

a well region formed in the substrate, the well region having a second opposite conductivity type;

a first region formed in the well region, the first region having the first conductivity type;

a second region formed in the well region, the second region having the first conductivity type;

a gate region, the gate region including a dielectric region located above the substrate surface between the first region and the second region to form a MOS transistor;

first connector which electrically couples the gate region and the first region to the oxide region; and, second connector which electrically couples the substrate to the second region;

wherein with the well region floating, a turn-on voltage of the MOS transistor is sufficiently low so that, when performing a plasma etch where charge is built up on the oxide region, before the charge built up is sufficient to place a breakdown voltage across the oxide region, the MOS transistor turns on and drains the charge to avoid damage to the oxide region.

13. The protection device recited in claim 12 wherein the first conductivity type is p-type.

14. The protection device recited in claim 13 wherein the second region is electrically coupled to ground.

15. The protection device recited in claim 12 wherein the first conductivity type is n-type.

16. The protection device recited in claim 15 wherein the second region is electrically connected to a power supply voltage.

17. The protection device recited in claim 12 wherein the oxide region to be protected is a gate dielectric region of a MOS transistor device to be protected.

18. The protection device recited in claim 12 wherein the oxide region to be protected is the oxide region of a gate-oxide capacitor.

19. The protection device recited in claim 12 wherein the clamping voltage of the protection device is less than the dielectric breakdown voltage of the device to be protected.

20. The protection device recited in claim 12 wherein:
the first conductivity type is p-type;
the second region is electrically coupled to ground; and,
the first region of the MOS transistor is also the collector of a lateral pnp device, the well region corresponds to the base of the lateral pnp device, and the second region of the MOS transistor is also the collector of the lateral pnp device.

21. The protection device as recited in claim 12 wherein:
the first conductivity type is n-type;
the second region is electrically connected to a power supply voltage; and,
the first region of the MOS transistor is also the collector of a lateral npn bipolar device, the well region corresponds to the base of the lateral bipolar device, and the second region of the MOS transistor is also the collector of the lateral npn bipolar device.

22. The protection device as recited in claim 12 wherein the clamp voltage of the protection device can be decreased by reducing the channel length of the MOS transistor.

23. The protection device as recited in claim 12 wherein the protection device prevents plasma charging damage to the oxide region regardless of polarity of the plasma.

* * * * *